US 6,576,480 B2

(12) United States Patent
Chen (10) Patent No.: US 6,576,480 B2
(45) Date of Patent: Jun. 10, 2003

(54) STRUCTURE AND METHOD FOR TRANSVERSE FIELD ENHANCEMENT (75) Inventor: Guoqing Chen, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/916,563

(22) Filed: Jul. 26, 2001

(65) Prior Publication Data

US 2003/0021146 A1 Jan. 30, 2003

(51) Int. Cl.[7] ............................................... H01L 21/00
(52) U.S. Cl. ............................................. 438/3; 438/49
(58) Field of Search ....................................... 438/3, 49

(56) References Cited

U.S. PATENT DOCUMENTS

| | | | | |
|---|---|---|---|---|
| 5,198,384 A | * | 3/1993 | Dennison | 438/3 |
| 5,804,458 A | * | 9/1998 | Tehrani et al. | 438/3 |
| 6,153,443 A | * | 11/2000 | Durlam et al. | 257/295 |
| 6,165,803 A | * | 12/2000 | Chen et al. | 438/3 |
| 6,184,045 B1 | * | 2/2001 | Hofman et al. | 438/3 |
| 6,184,080 B1 | * | 2/2001 | Miyai | 438/253 |
| 6,379,978 B2 | * | 4/2002 | Goebel et al. | 438/3 |
| 2001/0040778 A1 | * | 11/2001 | Abraham et al. | 360/324.2 |

* cited by examiner

Primary Examiner—Richard Elms
Assistant Examiner—Michael K. Luhrs
(74) Attorney, Agent, or Firm—Dorsey & Whitney LLP (57) ABSTRACT

Structures and methods for making a magnetic structure are discussed. Various embodiments increase a magnetic field to unambiguously select a magnetic memory cell structure. One method includes folding a current line into two portions around a magnetic memory cell structure. Each portion contributes its magnetic flux to increase the magnetic field to unambiguously select the magnetic memory cell structure. Another method increases the flux density by reducing a cross-sectional area of a portion of the current line, wherein the portion of the current line is adjacent to the to the magnetic memory cell structure.

18 Claims, 13 Drawing Sheets

STRUCTURE AND METHOD FOR TRANSVERSE FIELD ENHANCEMENT

TECHNICAL FIELD

This invention relates generally to magnetic structures. More particularly, it pertains to enhancing memory devices using magnetic material so that a desired memory cell is selected while other memory cells are unselected.

BACKGROUND OF THE INVENTION

A memory device is a device where information typically in the form of binary digits can be stored and retrieved. Such a device includes dynamic random access memory (DRAM), static random access memory (SRAM), and flash memory. Despite being slower, DRAMs are more commonly used than other memory types because they can be fabricated in high density to store a large amount of information. SRAMs are usually reserved for use in caches because they can operate at high speed. Unlike both DRAMs and SRAMs, which retain information as long as there is applied power, flash memory is a type of nonvolatile memory, which will keep information even if power is no longer applied. Flash memory is typically not used as main memory, however, because its block-oriented architecture prevents memory access in single-byte increments.

Figure 1A:
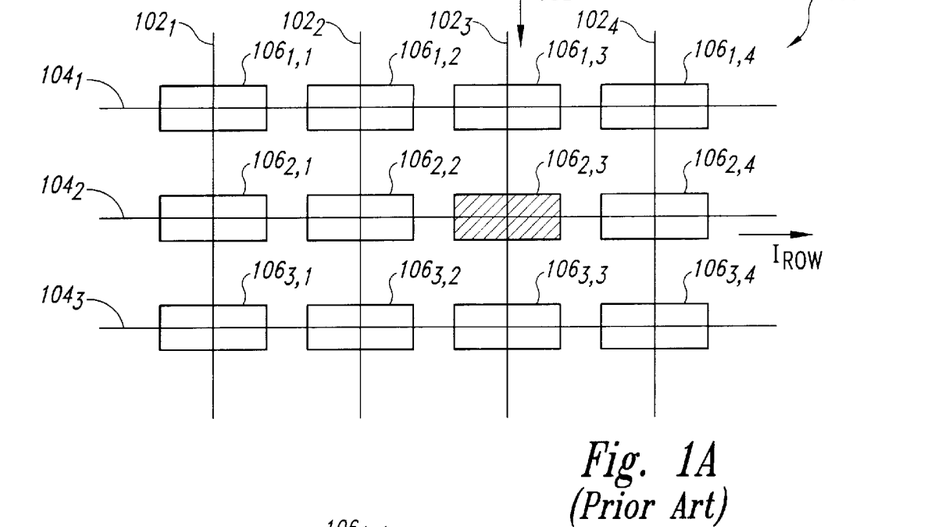
FIG. 1A is a block diagram showing a portion of an MRAM array according to the prior art.

Another memory type has emerged that can be fabricated in high density, operated at high speed, and retain information even after power is no longer applied. This memory type is magnetic random access memory (MRAM). FIG. 1A is a block diagram showing a portion of an MRAM array $100$ according to the prior art. The MRAM array $100$ includes a number of memory cells, such as memory cells $106_{1,1}$ to $106_{3,4}$, which are arranged in a number of rows (word lines), $104_1$ to $104_3$, and a number of columns (bit lines), $102_1$ to $102_4$. Each of these memory cells $106_{1,1}$ to $106_{3,4}$ stores information magnetically instead of electronically as in DRAMs, SRAMs, and flash memory. As an example, to select the memory cell $106_{2,3}$ for reading and writing, a row current $I_{row}$ is issued over the row $104_2$ and a column current ($I_{col}$) is issued over the column $102_3$.

Figure 1B:
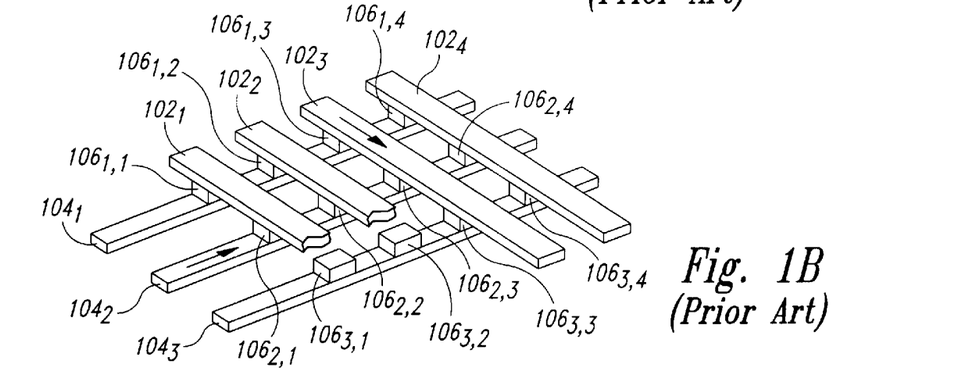
FIG. 1B is a partial cross-sectional isometric view of the portion of the MRAM array according to the prior art.

FIG. 1B is a partial cross-sectional isometric view of the portion of the MRAM array $100$ according to the prior art. Each memory cell is sandwiched between a portion of a row and a portion of a column. Rows and columns are formed from strips of conductive material. Following the example above, when the row current $I_{row}$ is present in the row $104_2$, the magnetic field $H_y$ that is generated by this current partially selects memory cells $106_{2,1}$ to $106_{2,4}$. When the column current $I_{col}$ is present in the row $102_3$, the magnetic field $H_x$ that is generated by this current partially selects memory cells $106_{1,3}$ to $106_{3,3}$. Because memory cell $106_{2,3}$ is exposed to both magnetic fields ($H_x$ and $H_y$), it is fully selected for reading or writing information.

Figure 1C:
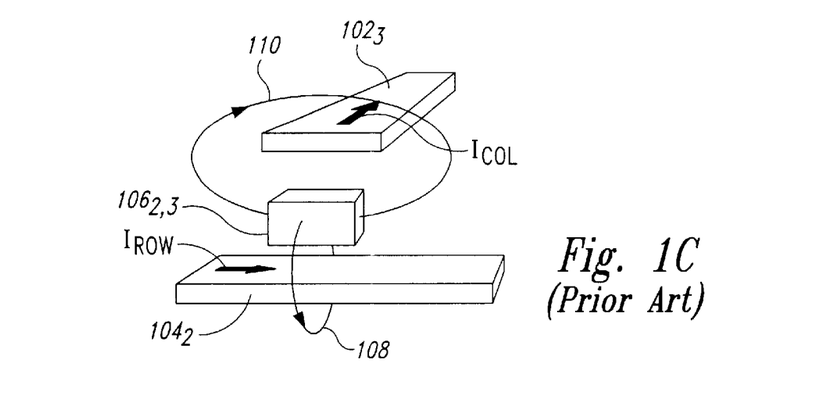
FIG. 1C is an exploded isometric view of a magnetic memory cell according to the prior art.

FIG. 1C is an exploded isometric view of the memory cell $106_{2,3}$ and a portion of the row $104_2$ and the column $102_3$ according to the prior art. The row current $I_{row}$ creates the magnetic field $H_y$ that comprises a magnetic flux line $108$ and the column current $I_{col}$ creates the magnetic field $H_x$ that comprises a magnetic flux line $110$. These magnetic flux lines, $108$ and $110$, change the dipolar orientation of the memory cell (north or south) $106_{2,3}$. In this way, by taking advantage of the dipolar nature of a magnetic material that comprises the memory cell $106_{2,3}$, a bit of information can be represented as a 0 or a 1.

Figure 1D:
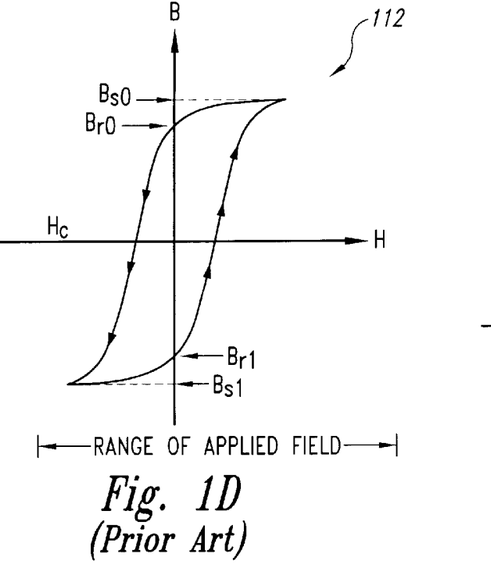
FIG. 1D is a graph showing the ferromagnetic nature of a memory cell according to the prior art.

FIG. 1D is a graph showing the ferromagnetic nature of the memory cell $106_{2,3}$ according to the prior art. The graph shows a hysteresis loop $112$, which shows the relationship of induction B as a function of magnetic field strength, H. With a sufficient coercive field $H_c$ applied to the memory cell $106_{2,3}$, the magnitude of the induction B rises until it levels off at a saturation induction, $B_{s0}$. The coercive field $H_c$ is a combination of the magnetic fields $H_x$ and $H_y$. As the coercive field $H_c$ is removed by withdrawing power to the memory cell $106_{2,3}$, much of the induction B is retained by dropping its magnitude to a remanent induction $B_{r0}$. This ability to retain the induction B even after power is no longer applied allows each memory cell of the MRAM array $100$ to be nonvolatile. The induction B can be moved to another saturation induction, $B_{s1}$, by the application of the coercive field $H_c$. When power is again withdrawn, the magnitude of the induction B drops slightly to settle at a remanent reduction $B_{r1}$. A bit of information can be magnetically represented as a 0 or a 1 by forcing the induction B to settle at the remanent induction $B_{r0}$ or $B_{r1}$.

Figure 1E:
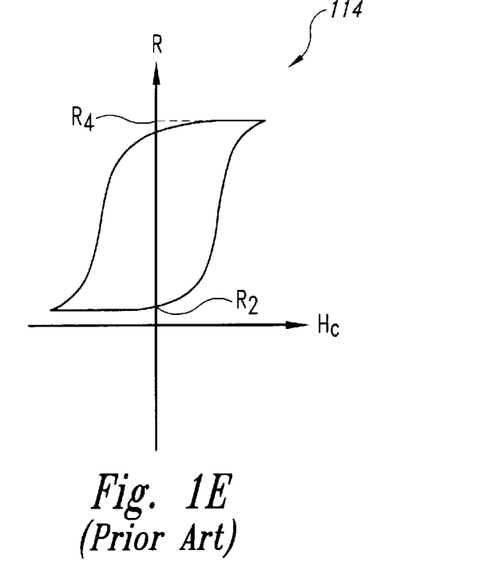
FIG. 1E is a graph showing the ferromagnetic nature of a memory cell as a relationship between resistance R and coercive field $H_c$ according to the prior art.

FIG. 1E is a graph showing the ferromagnetic nature of the memory cell $106_{2,3}$ as a relationship between resistance R and coercive field $H_c$ according to the prior art. This relationship is shown as a hysteresis loop $114$, which illustrates that the memory cell $106_{2,3}$ exhibits a high resistance $R_H$ at one magnetized orientation (remanent induction $B_{r0}$) and a low resistance $R_L$ at another magnetized orientation (remanent induction $B_{r1}$). As a practical matter, it is less complicated to measure resistance to determine whether a 0 or a 1 is being stored by the memory cell $106_{2,3}$ than to measure the induction B as shown in FIG. 1D.

Figure 1F:
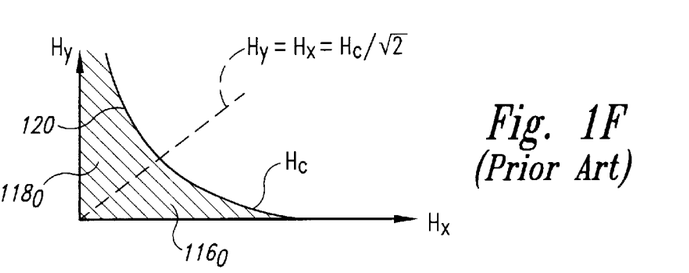
FIG. 1F is a graph showing the coercive field $H_c$ that defines the relationship between the magnetic field $H_y$, which is formed from the row current $I_{row}$, and the magnetic field $H_x$, which is formed from the column current $I_{col}$ according to the prior art.

FIG. 1F is a graph showing the coercive field $H_c$ that defines the relationship between the magnetic field $H_y$, which is formed from the row current $I_{row}$, and the magnetic field $H_x$, which is formed from the column current $I_{col}$ according to the prior art. The shaded area $116_0$, which is underneath the curve of the coercive field $H_c$, defines a region where the memory cell $106_{2,3}$ is partially selected but is not sufficiently selected for reading and writing information despite the application of one or both the magnetic fields $H_x$ and $H_y$. The area $118_0$, which is above the curve of the coercive field $H_c$, defines a region where the memory cell $106_{2,3}$ is fully selected because both the magnetic fields $H_x$ and $H_y$ are of a sufficient magnitude. The dashed line $120$ illustrates an application of both the magnetic fields $H_x$ and $H_y$ at the same magnitude to select the memory cell $106_{2,3}$ and to unselect (or partially select) memory cell $106_{2,3}$ when only one of the magnetic fields $H_x$ and $H_y$ is applied.

Figure 1G:
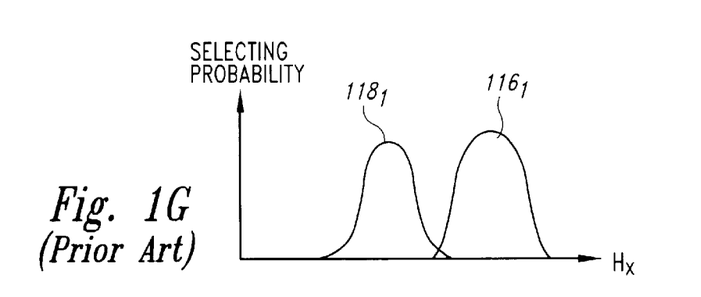
FIG. 1G is a graph showing a full-select probability distribution, which represents a range of values for the magnetic field $H_x$ where the memory cell is fully selected, and a partial-select probability distribution, which represents another range of values for the magnetic field $H_x$ where the memory cell is partially selected, according to one embodiment of the present invention.

FIG. 1G is a graph showing a full-select probability distribution $118_1$, which represents a range of $H_x$ where the memory cell is fully selected, and a partial-select probability distribution $116_1$, which represents another range of $H_x$ where the memory cell is partially selected, according to one embodiment of the present invention. The probability distribution $118_1$ reflects the application of both the magnetic fields $H_x$ and $H_y$ at the same magnitude to fully select the memory cell $106_{2,3}$. The probability distribution $116_1$ reflects the application of only the magnetic field $H_x$ but not $H_y$ to unselect (or partially select) the memory cell $106_{2,3}$. As shown, a portion of the area under the probability distribution $118_1$ overlaps with a portion of the area under the probability distribution $116_1$. This overlapped area indicates that an ambiguity exists in the process of selecting the memory cell $106_{2,3}$. For example, in certain circumstances, the memory cell $106_{2,3}$ may be fully selected even though only the magnetic field $H_x$ is applied. This accidental selection of a memory cell may compromise the integrity of the data stored by the memory cells.

Without a solution to unambiguously select a magnetic memory cell for reading and writing information, consumers may question the reliability of this type of memory device, which may lead to its eventual lack of acceptance in the marketplace. Thus, there is a need for structures and methods to increase the reliability of magnetic memory devices.

SUMMARY OF THE INVENTION

An illustrative aspect of the present invention includes various methods for increasing a magnetic field to unambiguously select a magnetic memory cell structure. One method includes folding a current line into two portions around a magnetic memory cell structure. Each portion contributes its magnetic flux to increase the magnetic field to unambiguously select the magnetic memory cell structure. Another method increases the flux density by reducing a cross-sectional area of a portion of the current line, wherein the portion of the current line is adjacent to the magnetic memory cell structure.

DETAILED DESCRIPTION OF THE INVENTION

In the following detailed description of various embodiments of the invention, reference is made to the accompanying drawings, which form a part hereof, and in which are shown, by way of illustration, specific embodiments in which the invention may be practiced. In the drawings, like numerals describe substantially similar components throughout the several views. The lateral sizes and thicknesses of the various layers are not drawn to scale and these various layers or layer portions are arbitrarily enlarged or reduced to improve drawing legibility. These embodiments are described in sufficient detail to enable those skilled in the art to practice the invention. Other embodiments may be utilized and structural, logical, electrical, and other changes may be made without departing from the spirit or scope of the present invention. The following detailed description is, therefore, not to be taken in a limiting sense.

Figure 2A:
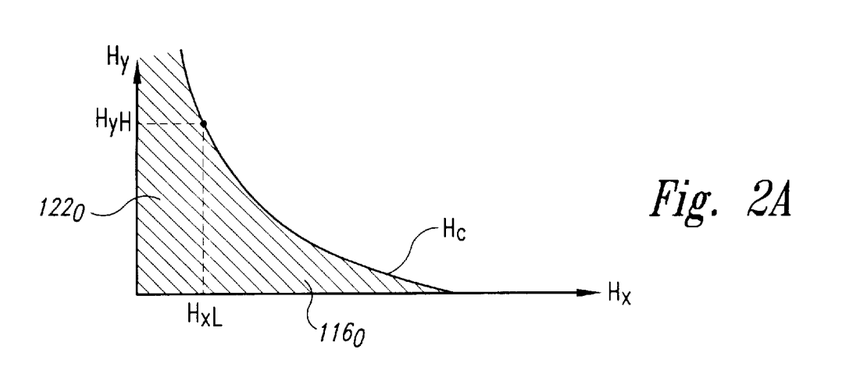
FIG. 2A is a graph showing the coercive field $H_c$ that defines the relationship between the magnetic field $H_y$, which is formed from the row current $I^{row}$, and the magnetic field $H_x$, which is formed from the column current $I_{col}$ according to one embodiment of the present invention.
Figure 2B:
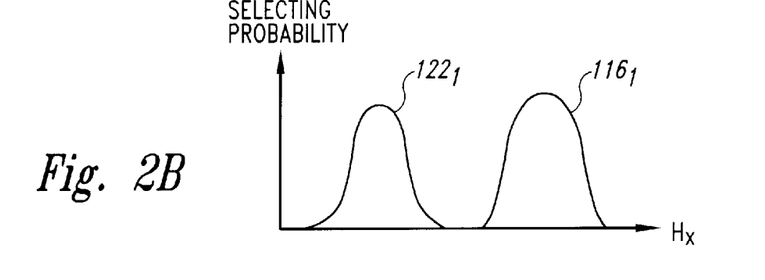
FIG. 2B is a graph showing a full-select probability distribution, which represents a range of $H_x$ where the memory cell is fully selected, and a partial-select probability distribution, which represents another range of $H_x$ where the memory cell is partially selected, according to one embodiment of the present invention.

FIG. 2A is a graph showing the coercive field $H_c$ that defines the relationship between the magnetic field $H_y$, which is formed from the row current $I_{row}$, and the magnetic field $H_x$, which is formed from the column current $I_{col}$, according to one embodiment of the present invention. FIG. 2B is a graph showing a full-select probability distribution $122_1$, which represents a range of $H_x$ where the memory cell is fully selected, and a partial-select probability distribution $116_1$, which represents another range of $H_x$ where the memory cell is partially selected, according to one embodiment of the present invention. The area $122_0$, which is above the curve of the coercive field $H_c$, defines a region where the memory cell is fully selected because both the magnetic fields $H_x$ and $H_y$ are of a sufficient magnitude.

Unlike the prior art, the full-select probability distribution $122_1$ is separated from the partial-select probability distribution $116_1$ so that any memory cell can be unambiguously selected. Various embodiments of the present invention separate the probability distributions $122_1$ from $116_1$ by increasing the magnetic field $H_y$ to a level $H_{yH}$ while lowering the magnetic field $H_x$ to a level $H_{xL}$. Recall that the magnetic field $H_y$ is generated from the row current $I_{row}$. Thus, one technique to increase the magnetic field $H_y$ is to increase the row current $I_{row}$. However, depending on the material that is used to form a word line in which the row current $I_{row}$ flows, an increased row current $I_{row}$ may cause electromigration. Other problems associated with an increased row current $I_{row}$ include increased power dissipation and heat.

Figure 3A:
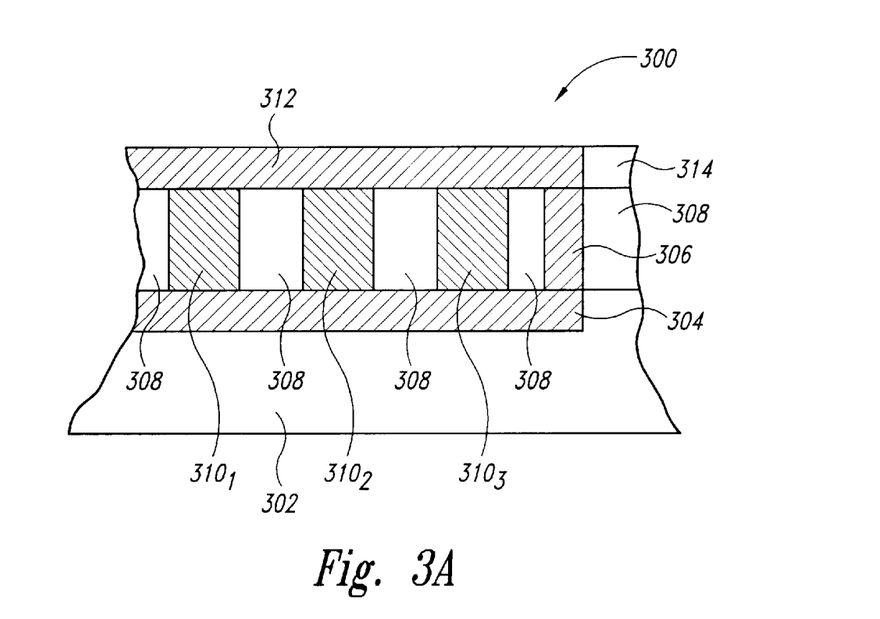
FIG. 3A is a cross-sectional view of a magnetic structure according to one embodiment of the present invention.

The embodiments of the present invention avoid the need to increase the row current $I_{row}$ yet still manage to increase the magnetic field $H_y$ by various methods. These methods are illustrated below using magnetic structures. One such magnetic structure is shown by FIG. 3A, which illustrate one method to increase the magnetic field $H_y$. Another method is shown by magnetic structures illustrated in FIGS. 4A and 5A.

FIG. 3A is a cross-sectional view of a magnetic structure 300 according to one embodiment of the present invention, which presents one method to increase the magnetic field $H_y$. The steps to fabricate the magnetic structure 300 are illustrated in FIGS. 3B–3G, which are discussed hereinbelow. The magnetic structure 300 includes a substrate 302 in which a conductive line 304 is formed to conduct a row current $I_{row}$. A number of memory cells, such as $310_1$, $310_2$, and $310_3$, are fabricated on the conductive line 304. For the sake of brevity, these memory cells, $310_1$, $310_2$, and $310_3$, may include multiple layer memory cells but are not shown here so as to focus on the embodiments of the present invention. These memory cells, $310_1$, $310_2$, and $310_3$, are electrically isolated from one another and structurally supported by a layer of nonconductive material 308. Another conductive line 312, which is to further conduct the row current $I_{row}$, is fabricated on the nonconductive layer 308 and the memory cells $310_1$, $310_2$, and $310_3$. The conductive line 304 and the conductive line 312 are electrically coupled together through a via 306 in which a conductive material is filled.

The magnetic structure 300 increases the magnetic field $H_y$ by increasing the magnetic flux lines that couple the memory cells $310_1$, $310_2$, and $310_3$. To illustrate this, suppose the row current $I_{row}$ flows in the conductive line 304 from left to right. Using the right-hand rule, a set of magnetic flux lines that are generated by the row current $I_{row}$ can be visualized as a number of rings, which encircle the conductive line 304 by entering into a page on which FIG. 3A is drawn at a certain distance below the conductive line 304, and exit out of the page at a certain distance above the conductive line 304 to couple the memory cells $310_1$, $310_2$, and $310_3$.

The row current $I_{row}$ flows from the conductive line 304 to enter the via 306, and from the via 306, the row current $I_{row}$ flows in the conductive line 312 from the right to the left. Again using the right-hand rule, another set of magnetic flux lines encircles the conductive line 312 by entering into the page on which FIG. 3A is drawn at a certain distance above the conductive line 312, and exits out of the page at a certain distance below the conductive line 312 to couple the memory cells $310_1$, $310_2$, and $310_3$. The two sets of magnetic flux lines generated from the conductive lines 304 and 312 help to increase the magnetic field $H_y$ over the set of magnetic flux lines generated from the conductive line 304 alone.

In alternative embodiments of the present invention, the magnetic field coupling the magnetic memory cell is increased by increasing the induction B. The magnitude of the induction B is the flux density, which is in turn proportional to the current density. Recall that the current density is defined as the magnitude of current per unit area or (I/A), wherein I is the magnitude of current and A is the cross-sectional area of the conductor in which the current is conducting. Thus, increasing the current density consequently increases the induction B. Based on the relationship between current and cross-sectional area of the conductor, the current density can be increased by increasing the magnitude of the current or decreasing the cross-sectional area of the conductor, or both. Some embodiments of the present invention increase the induction B by decreasing the cross-sectional area of the conductor in the proximity of the magnetic memory cell.

Figure 4A:
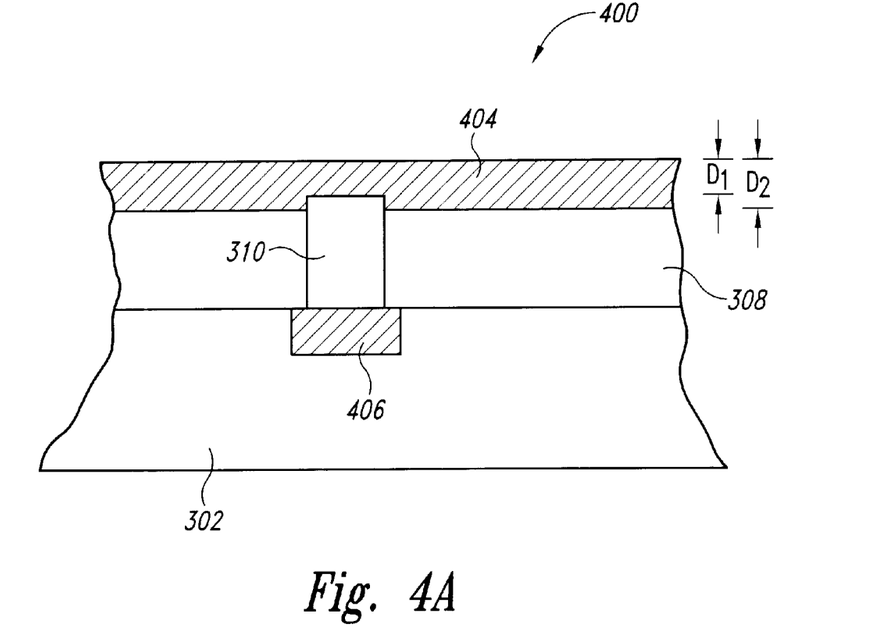
FIG. 4A is a cross-sectional view of a magnetic structure according to one embodiment of the present invention.

A cross-sectional view of one such magnetic structure is illustrated in FIG. 4A as a magnetic structure 400. FIGS. 4B–4F, which are discussed below, provide cross-sectional views of the magnetic structure 400 at various steps during its fabrication. Although only one memory cell 310 is illustrated in FIG. 4A, it will be appreciated that the present embodiment may be applied to an entire array of memory cells. As shown in FIG. 4A, the memory cell 310 is formed on a conductive line 406 that can be visualized as extending into and out of the page on which FIG. 4A is drawn. The conductive line 406 is itself formed in a substrate 302, and is used to conduct a column current $I_{col}$. A nonconductive layer 308 electrically isolates the memory cell 310 from adjacent memory cells (not shown), and provides a structure on which subsequent layers are formed. Another conductive line 404 is formed on the nonconductive layer 308 and over a portion of the memory cell 310 that remains exposed through the non-conductive layer 308. The conductive line 404 is used to provide a row current $I_{row}$. As will be described in more detail below, by forming the conductive layer 404 such that the resulting cross-sectional area of the portion passing over the magnetic cell is less than the cross-sectional area of the remaining portions of the conductive layer 404, a higher flux density, and consequently, a higher magnetic field $H_y$, is created in the region proximate to the memory cell 310.

Figure 5A:
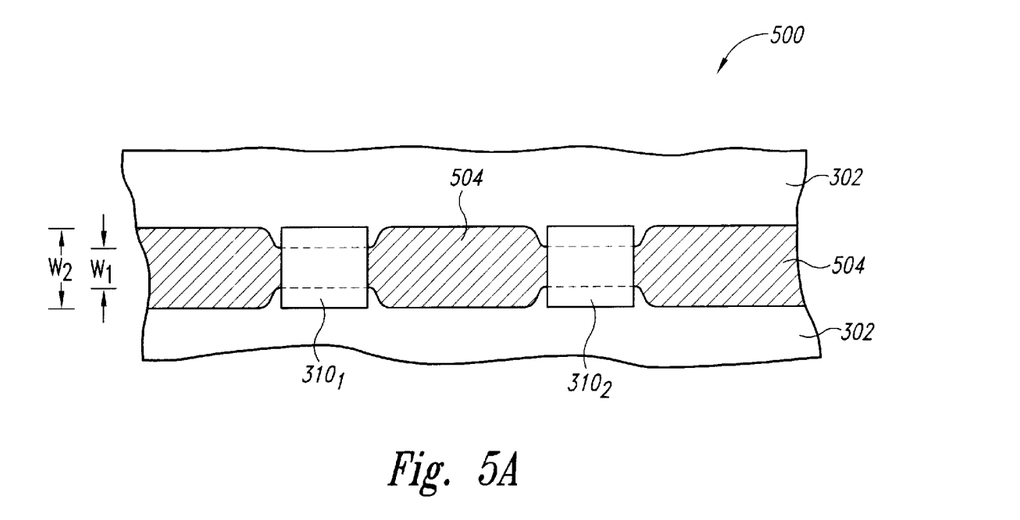
FIG. 5A is a cross-sectional plan view of a magnetic structure according to one embodiment of the present invention.
Figure 5B:
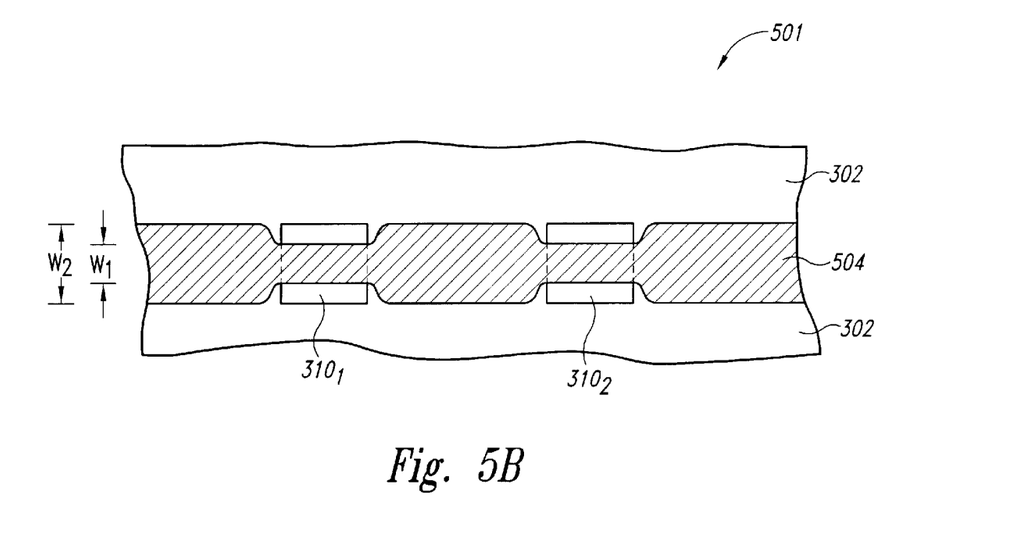
FIG. 5B is a cross-sectional plan view of a magnetic structure according to another embodiment of the present invention.

Another cross-sectional view of a magnetic structure 500 in which the induction B is increased by decreasing the cross-sectional area of the conductor is shown in FIG. 5A. FIGS. 5C–5G show a fabrication process at various steps that produces the magnetic structure 500. Two memory cells, $310_1$ and $310_2$, are shown but it should be appreciated that the present embodiment may be applied to an entire array of memory cells. FIG. 5B shows another cross-sectional view of another magnetic structure 501 that increases the induction B in a similar way as shown in FIG. 5A except that the two memory cells, $310_1$ and $310_2$, instead of being fabricated above are fabricated under the conductive line 504.

The conductive line 504 is formed in a substrate 302 to conduct a row current $I_{row}$. Because the conductive line 504 is fabricated under the two memory cells $310_1$ and $310_2$, for clarity purposes the outline of the conductive line 504 is shown as a dashed line underneath the memory cells $310_1$ and $310_2$. The conductive line 504 has a width W1 below the memory cells $310_1$ and $310_2$ and another width W2 over other sections of the magnetic structure 500 that are not below the memory cells $310_1$ and $310_2$. As illustrated in FIG. 5A, the width W1 is less than the width W2. Suppose that the conductive line 504 has a uniform thickness, a cross-sectional area of the conductive line 404 is less than a cross-sectional area taken at other sections. As a result, the difference in the cross-sectional area helps to increase the magnetic field $H_y$ by increasing the induction B. As explained hereinabove, increasing the current density consequently increases the induction B, and therefore, increases the magnetic field $H_y$.

FIGS. 3B–3G are cross-sectional views of the magnetic structure 300 during processing according to one embodiment of the present invention, which has been earlier summarized in FIG. 3A. These Figures describe an embodiment that increases the magnetic field $H_y$ by folding a conductive line around a memory cell to increase the magnetic flux. The discussion in FIGS. 3B–3G illustrates a few of the steps associated with a fabrication process. The entire fabrication process is not discussed so as to focus on the embodiments of the present invention. Other methods of fabrication are also feasible and perhaps equally viable.

Figure 3B:
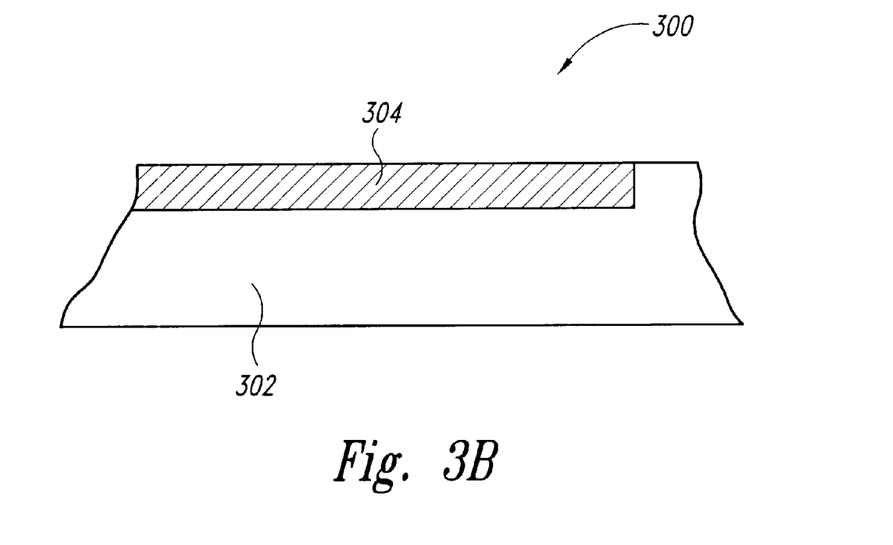
FIGS. 3B–3G are cross-sectional views of a magnetic structure during processing according to one embodiment of the present invention.

FIG. 3B is a cross-sectional view of the magnetic structure 300 during the next sequence of processing according to one embodiment of the present invention. The substrate 302 can be fabricated from any suitable substances and compounds, such as lightly doped n-type or p-type material or a lightly doped epitaxial layer on a heavily doped substrate. Using a damascene process, a trench of about 4000 to 5000 angstroms deep is etched into the substrate 302, which is followed by an electrochemical plating (ECP) process to deposit a highly conductive material, such as copper, and is finished off with a polishing process, such as chemical mechanical polishing (CMP), to level the copper overfill. The result of the damascene process is the conductive line 304 as shown in FIG. 3B. As discussed above in FIG. 3A, this conductive line 304 will be used to conduct a row current (or word line) to select a memory cell.

Figure 3C:
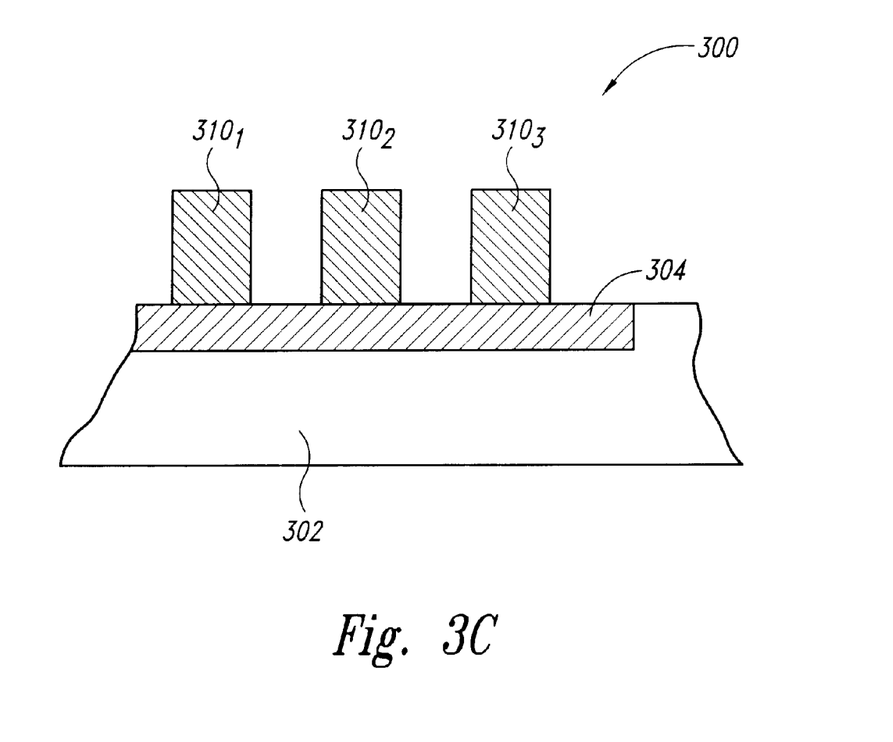

FIG. 3C is a cross-sectional view of the magnetic structure 300 during the next sequence of processing according to one embodiment of the present invention. A number of memory cells, such as $310_1$, $310_2$, and $310_3$, are fabricated over the conductive line 304. The fabrication process involves a number of photolithographic, etching, and deposition steps to form the memory cells from a number of materials, such as seed materials, anti-ferromagnetic materials, ferromagnetic materials, tunneling materials, and barrier materials. Because the fabrication process of the memory cells does not limit the present invention, such a process will not be explained here in full so as to focus more clearly on the present embodiment.

Figure 3D:
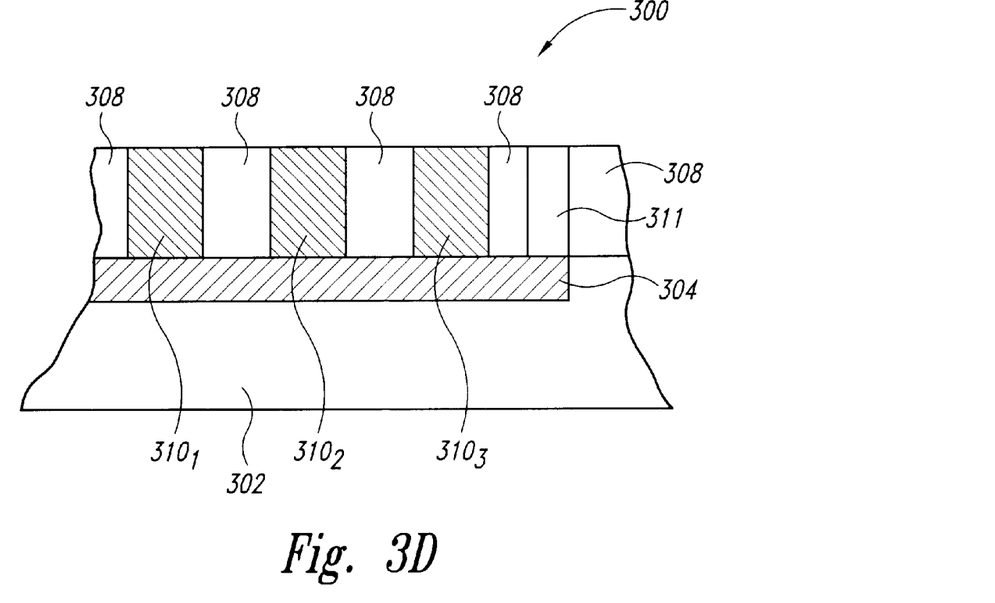

FIG. 3D is a cross-sectional view of the magnetic structure 300 during the next sequence of processing according to one embodiment of the present invention in which a nonconductive layer 308 is deposited, photolithographed, and etched to electrically isolate and structurally protect the memory cells $310_1$, $310_2$, and $310_3$. The same etching process also forms an opening 311 which will define the via 306 through the nonconductive layer 308. A suitable dielectric material for the nonconductive layer 308 includes silicon dioxide, but any other suitable dielectric materials may be used. A suitable deposition technique includes chemical-vapor deposition and a suitable etching technique includes plasma etching. Other suitable deposition and etching techniques may be used without limiting the embodiments of the present invention.

Figure 3E:
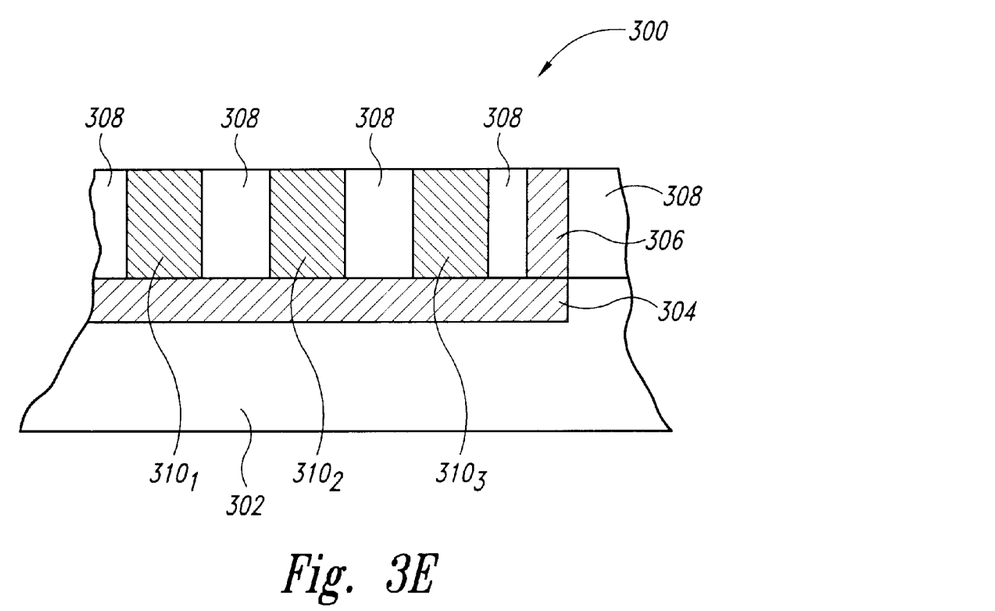

FIG. 3E is a cross-sectional view of the magnetic structure 300 during the next sequence of processing according to one embodiment of the present invention. A conductive material, such as tungsten, is deposited, photolithographed, and etched to form the via 306 from the opening 311. Any suitable deposition technique, such as sputtering, and any suitable etching technique, such as a wet etch, may be used. Other suitable deposition and etching techniques may be used without limiting the embodiments of the present invention.

Figure 3F:
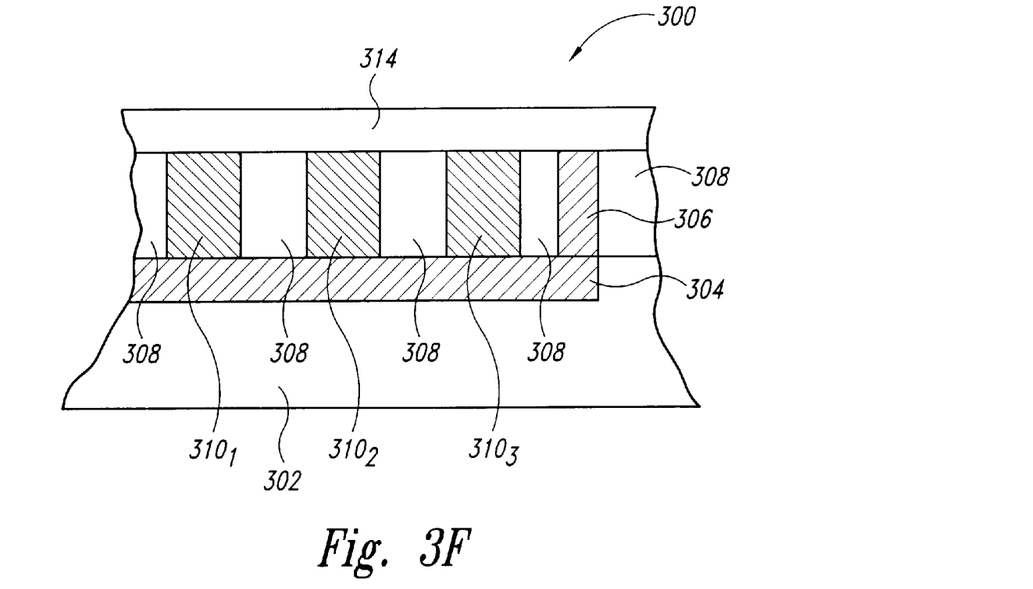

FIG. 3F is a cross-sectional view of the magnetic structure 300 during the next sequence of processing according to one embodiment of the present invention in which a nonconductive layer 314 is deposited to electrically isolate and structurally protect the memory cells $310_1$, $310_2$, $310_3$, and the via 306. A suitable dielectric material for the nonconductive layer 314 includes silicon dioxide, but any other suitable dielectric materials may be used. A suitable deposition technique includes chemical-vapor deposition and a suitable etching technique includes plasma etching. Other suitable deposition and etching techniques may be used without limiting the embodiments of the present invention.

Figure 3G:
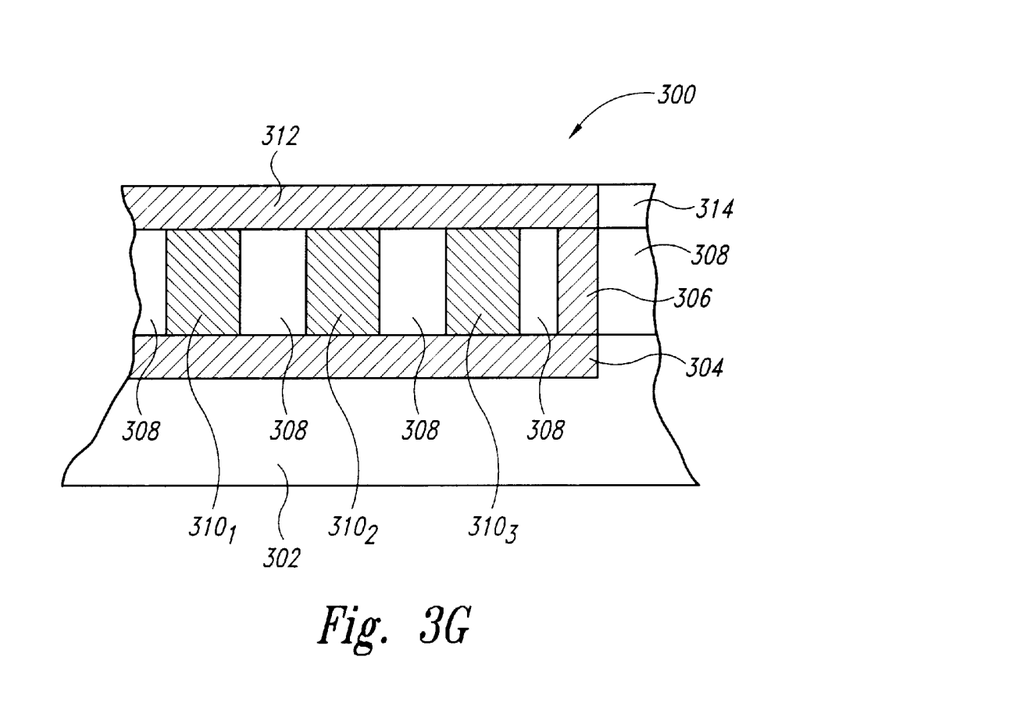

FIG. 3G is a cross-sectional view of the magnetic structure 300 during the next sequence of processing according to one embodiment of the present invention. A damascene process is applied to the nonconductive layer 314 to form a trench in the nonconductive layer 314 of about 4000 to 5000 angstroms deep above the memory cells $310_1$, $310_2$, and $310_3$. This etching process is followed by an electrochemical plating process to deposit a highly conductive material, such as copper, and any overfilled conductive material is planarized by a polishing process, such as chemical mechanical polishing. The result of the damascene process is the conductive line 312 as shown in FIG. 3G. As discussed above in FIG. 3A, this conductive line 312 generates additional magnetic flux, which together with the magnetic flux generated by the conductive line 304, help to increase the magnetic field $H_y$ without increasing the row current to select a memory cell.

The process of fabricating the embodiment shown in FIG. 4A will now be discussed with respect to FIGS. 4B–4F. The discussion in FIGS. 4B–4F illustrates a few of the steps associated with a fabrication process. The entire fabrication process is not discussed so as to focus on the embodiments of the present invention. Other methods of fabrication are also feasible and perhaps equally viable.

Figure 4B:
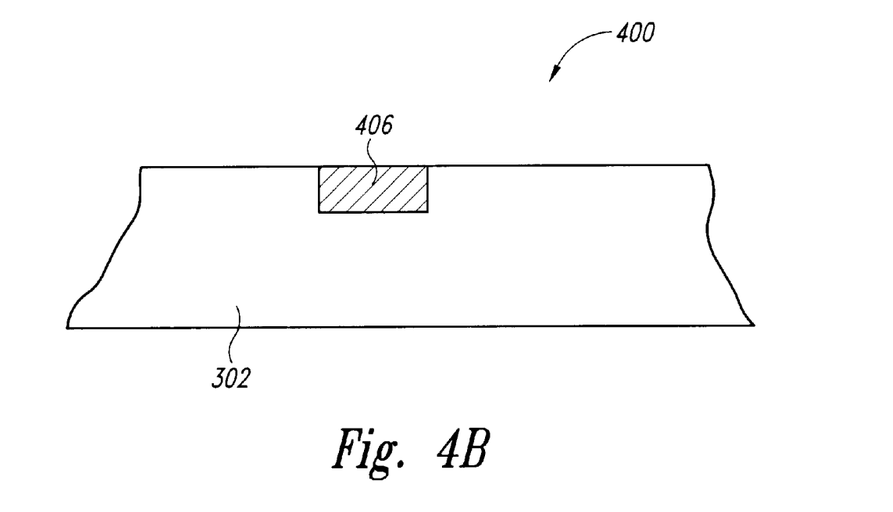
FIGS. 4B–4F are cross-sectional views of a magnetic structure during processing according to one embodiment of the present invention.

FIG. 4B illustrates the formation of a conductive line 406 in a substrate 302. The substrate 406 can be fabricated from any suitable substances and compounds, such as a lightly doped n-type or p-type material, a lightly doped epitaxial layer, or the like. The conductive line 406 can be formed using a damascene process. That is, a trench having a depth of approximately 4000 to 5000 angstroms is first etched into the substrate 302. The trench is then filled with a conductive material, such as copper, and any overfill is leveled with a polishing process, such as chemical mechanical polishing.

Figure 4C:
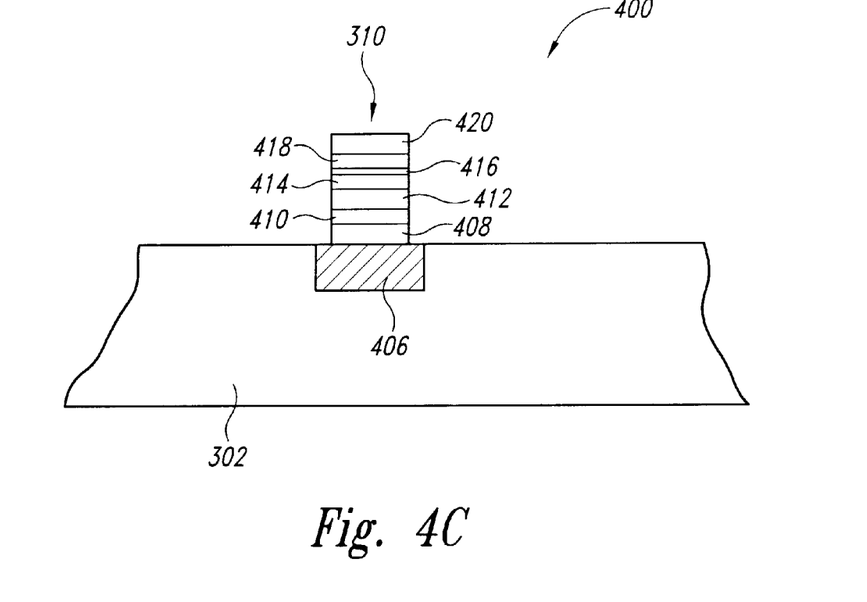

FIG. 4C illustrates the formation of a multi-layer memory cell 310 on the conductive line 406. A barrier layer 408 of tantalum having a thickness of approximately 5 nanometers is first formed to inhibit diffusion of copper atoms from the metal line 406. A layer 410 of nickel ferrite having a thickness of approximately 6 nanometers is formed over the barrier layer 408. Together, the layer 410 and the tantalum layer 408 act as a seed layer to orient the crystalline lattice structure of materials deposited on the nickel ferrite layer 410 to a particular orientation. For example, in one embodiment of the present invention, the seed layer provides a "111" crystalline orientation for subsequent layers.

An anti-ferromagnetic layer 412 of a magnesium ferrite material with a thickness of about 10 nanometers is then formed on the nickel ferrite layer 410. The anti-ferromagnetic layer 412 is fabricated on top of the nickel ferrite layer 410 to act as a pinning layer to pin any magnetic layer which is formed thereon to a certain magnetic orientation and inhibit the particular magnetic orientation from changing. Formed on top of the anti-ferromagnetic 412 is a ferromagnetic layer 414 of a nickel ferrite material. The ferromagnetic layer 414 has a thickness of approximately 6 nanometers, and acts as a pinned layer having a fixed magnetic orientation. A tunneling layer 416, through which electrons are allowed to tunnel so that a current can be measured to derive the resistance of the memory cell 310, is formed from a dialuminum trioxide layer having a thickness of approximately 1.5 nanometers, and deposited on the ferromagnetic layer 414. A sense layer 418 of nickel ferrite with a thickness of about 4 nanometers is formed on the tunneling layer 416 to act as a sense layer having a magnetic orientation that can be changed. Depending on the magnetic orientation of the ferromagnetic layer 418 with respect to the fixed magnetic orientation of the ferromagnetic layer 414, the resistance of the memory cell 310 can be measured, from which a bit of information stored by the memory cell 310 can be determined. The memory cell 310 is completed with another tantalum layer 420 having a thickness of about 5 nanometers which acts as a barrier layer in a manner similar to the tantalum layer 408 previously discussed.

Figure 4D:
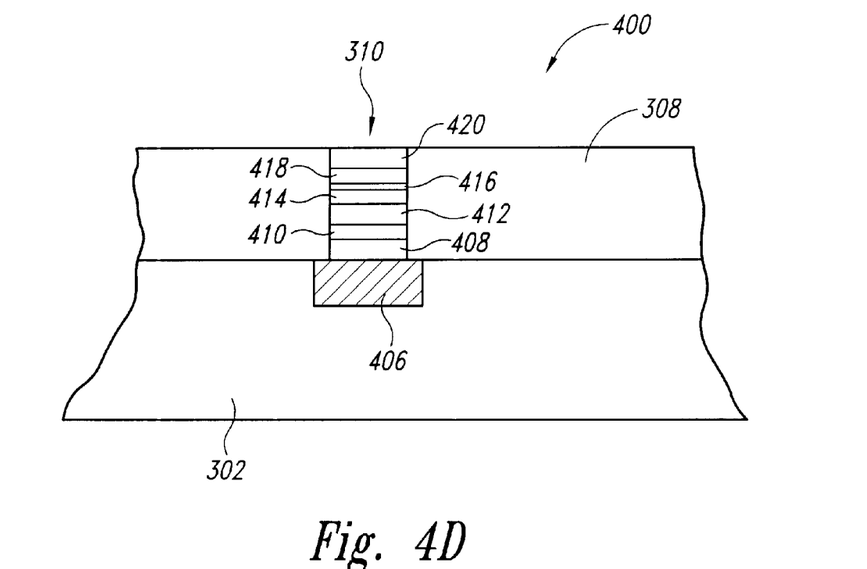
Figure 4E:
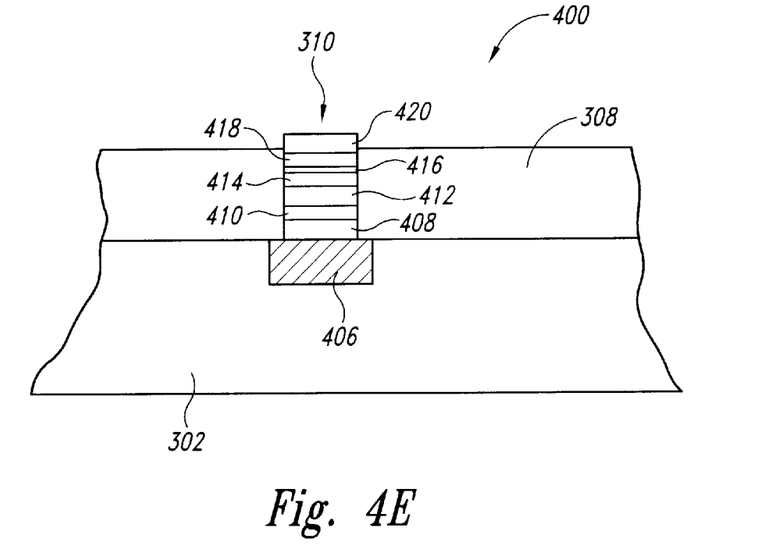
Figure 4F:
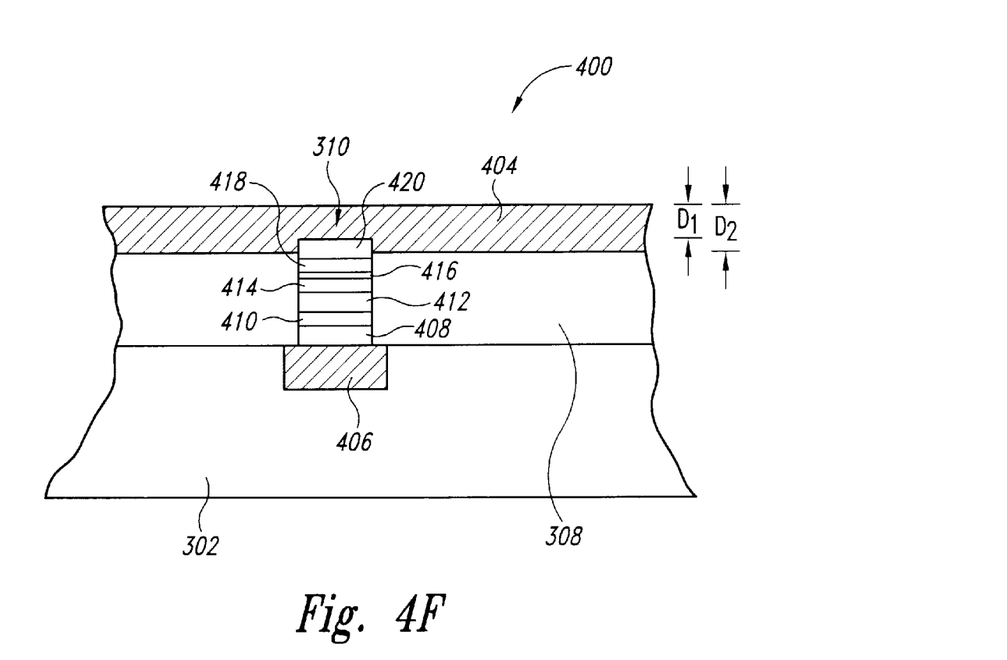

FIG. 4D illustrates the magnetic structure 400 following the formation of a nonconductive layer 308. A nonconductive layer is deposited over the memory cell 310 and then planarized to produce a level surface. As mentioned previously, the non-conductive layer 308 electrically isolates and structurally protects the memory cell 310. A suitable dielectric material for the non-conductive layer 308 includes silicon dioxide. However, other suitable dielectric materials may be used as well. In FIG. 4E, as part of a damascene process, an etching step has been used to form a trench approximately 4000 to 5000 angstroms deep in the non-conductive layer 308 to expose at least a portion of the memory 310. As shown in FIG. 4E, the etching step exposes the barrier layer 420. It is recommended that the etching step should not etch beyond the boundary between the tunneling layer 416 and the ferromagnetic layer 414. As shown in FIG. 4F, following the formation of the trench, a conductive material, such as copper, is deposited into the trench to form a conductive line 404. Any overfill of the conductive material is removed through a planarization process, such as through chemical mechanical polishing.

As a result of the upper surface of the conductive line 404 being relatively level, the depth D1 of the conductive line 404 in the region over the memory cell 310 is less than the depth D2 of the conductive line 404 in the region over the non-conductive layer 308. Consequently, because the width (not shown) of the conductive line 404 is relatively uniform, the cross-sectional area in the region proximate to the memory cell 310 is less than that for elsewhere along the conductive line 404. The region of decreased cross-sectional area provides a region along the conductive line 404 where the current density, and hence the flux density, is increased to provide a region of increased magnetic field strength to be coupled to the memory cell 310.

The process of fabricating the embodiment shown in FIG. 5A is now discussed with respect to FIGS. 5B–5G. The discussion in FIGS. 5B–5G illustrates a few of the steps associated with a fabrication process. The entire fabrication process is not discussed so as to focus on the embodiments of the present invention. Other methods of fabrication are also feasible and perhaps equally viable.

Figure 5C:
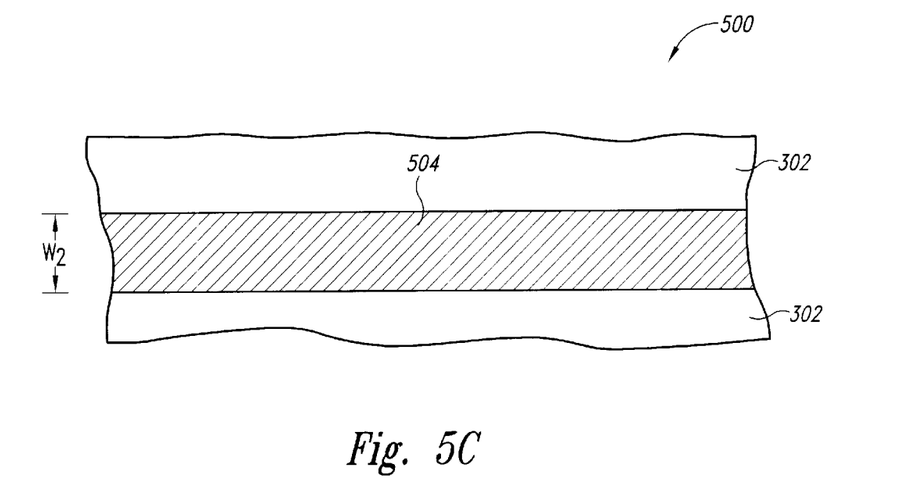
FIGS. 5C–5G are cross-sectional plan views of a magnetic structure during processing according to one embodiment of the present invention.

FIG. 5C is a cross-sectional plan view of the magnetic structure 500 showing the formation of a conductive line 504 in a substrate 302. The substrate 302 can be fabricated from any suitable substances and compounds, such as lightly doped n-type or p-type material or a lightly doped epitaxial layer on a heavily doped substrate. Using a damascene process, a trench of about 4000 to 5000 angstroms deep is etched into the substrate 302, which is followed by an electrochemical plating process to deposit a highly conductive material, such as copper, and is finished off with a polishing process, such as chemical mechanical polishing to level the copper overfill. The result of this damascene process is the conductive line 504 having a certain width W2.

Figure 5D:
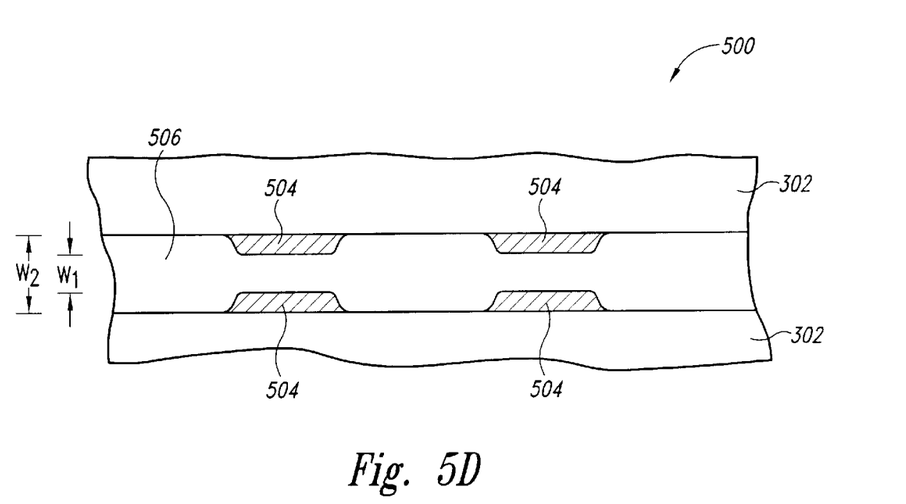
Figure 5E:
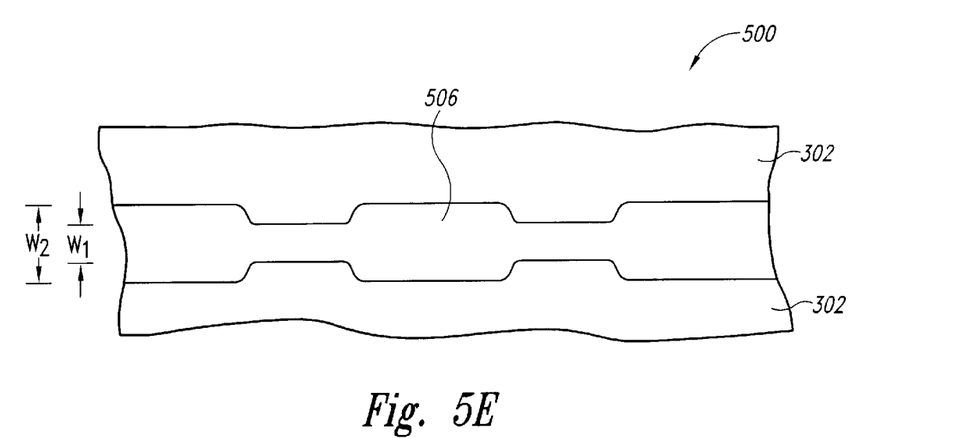
Figure 5F:
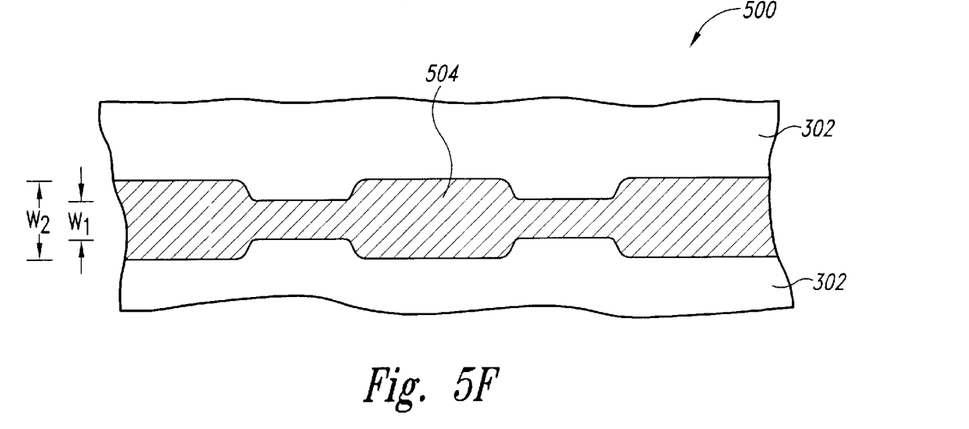

FIG. 5D is a cross-sectional plan view of the magnetic structure 500 during the next sequence of processing in which a photolithographic step is applied to form a mask 506 from a resist material. The mask 506 exposes certain portions of the conductive line 504 so that these exposed portions of the conductive line 504 have a width W1, which is less than the width W2. FIG. 5E illustrates the etching of the exposed portions of the conductive line 504. A suitable etching technique includes a dry etch process, such as plasma etching. Should a wet etch process be desired, an organic solvent is recommended be used to etch away the exposed areas of the conductive line 504. FIG. 5F illustrates the stripping of the mask 506 using a solution, such as hydrochloric acid. Once the mask 506 is stripped away, what is remained is a patterned conductive line 504 having two different widths, W1 and W2.

Figure 5G:
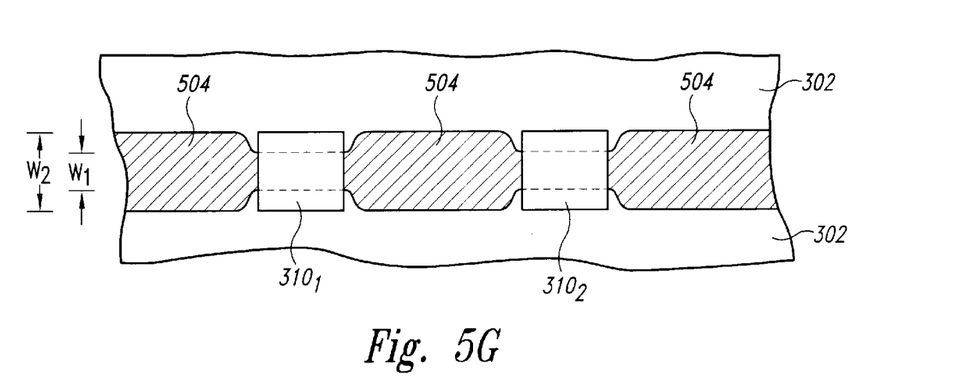

FIG. 5G illustrates the formation of a number of memory cells, such as memory cells $310_1$ and $310_2$, on various sections of the conductive line 504 that have the width W1. These memory cells may have multiple layers, such as those discussed in FIG. 4C above. FIG. 5G is similar to FIG. 5A in that the memory cells are fabricated over the conductive line 504. However, an equivalent structure is to fabricate the memory cells first, which is then followed by the fabrication of the conductive line 504, as shown in FIG. 5B.

Figure 6:
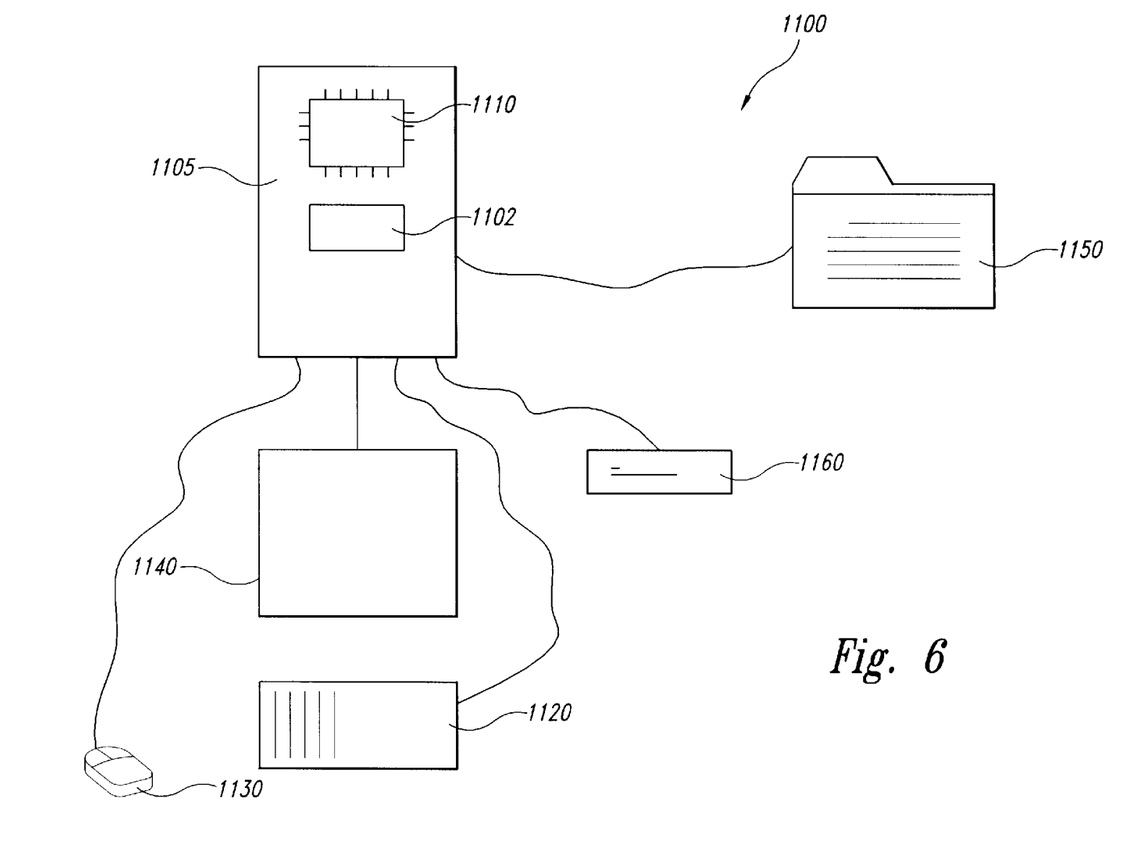
FIG. 6 is a block diagram of a computer system according to one embodiment of the present invention.

FIG. 6 is a block diagram of a computer system according to one embodiment of the present invention. Computer system 1000 contains a processor 1110 and a memory system 1102 housed in a computer unit 1105. Computer system 1100 is but one example of an electronic system containing another electronic system, e.g., memory system 1102, as a subcomponent. The memory system 1102 may include a magnetic structure as discussed hereinabove in various embodiments of the present invention. Computer system 1100 optionally contains user interface components. These user interface components include a keyboard 1120, a pointing device 1130, a monitor 1140, a printer 1150, and a bulk storage device 1160. It will be appreciated that other components are often associated with computer system 1100 such as modems, device driver cards, additional storage devices, etc. It will further be appreciated that the processor 1110 and memory system 1102 of computer system 1100 can be incorporated on a single integrated circuit. Such single-package processing units reduce the communication time between the processor and the memory circuit.

Structures and methods have been discussed to address a desire to unambiguously select a particular memory cell for reading and writing information. At least three embodiments of the present invention have been presented. All of these embodiments focus on increasing the magnetic field $H_y$, which is generated by the row current (word line). One of the embodiments focuses on increasing the magnetic flux by folding a conductive line, which conducts the row current. The other two embodiments focus on increasing the flux density by decreasing the cross-sectional area of the conductive line. The embodiments of the present invention enhance the manufacturing of magnetic memory devices to produce more reliable products for consumers.

Although the specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. It is to be understood that the above description is intended to be illustrative, and not restrictive. Combinations of the above embodiments and other embodiments will be apparent to those of skill in the art upon reviewing the above description. The scope of the invention includes any other applications in which the above structures and fabrication methods are used. Accordingly, the scope of the invention should only be determined with reference to the appended claims, along with the full scope of equivalents to which such claims are entitled.

I claim:

1. A method for forming a magnetic structure, comprising:

forming a first conductive line parallel a first axis having two terminals and two sides;

forming a second conductive line parallel a second axis having two terminals and two sides;

forming a via electrically coupling one of the terminals of the first conductive line to one of the terminals of the second conductive line; and forming a magnetic memory cell structure interposed between the first and second conductive lines having four sides, one of the four sides adjoining to one of the two sides of the first conductive line, another of the four sides adjoining to one of the two sides of the second conductive line, the another of the four sides oppositely situated with respect to the one of the four sides.

2. The method of claim 1, wherein the first axis is parallel to the second axis.

3. The method of claim 1, wherein forming the magnetic memory cell structure includes multiple layers, each layer selected from a group consisting of a barrier layer, a seed layer, a pinning layer, a pinned layer, a tunneling layer, and a sense layer.

4. A method for making a magnetic structure, comprising:
   forming a memory cell structure having multiple layers, the multiple layers including a first ferromagnetic layer, a tunneling layer, a second ferromagnetic layer and a barrier layer formed superjacent the first ferromagnetic layer;
   forming a nonconductive layer that overlies the magnetic memory cell structure;
   etching the nonconductive layer to expose a portion of the multiple layers, the exposed portion of the multiple layers excluding the tunneling layer; and
   forming a conductive layer over the magnetic memory cell structure and the nonconductive layer, the conductive layer having a first dimension in an area over the nonconductive layer and a second dimension in an area over the portion of the top layer of the magnetic memory cell structure, the magnitude of the second dimension less than the magnitude of the first dimension.

5. The method of claim 4, wherein said etching includes etching the nonconductive layer to expose a portion of the barrier layer.

6. The method of claim 5, wherein said etching includes etching using a dry etch technique.

7. The method of claim 5, wherein said etching includes etching to form a trench for a copper damascene process.

8. A method for making a magnetic structure, comprising:
   forming a memory cell structure having multiple layers, the multiple layers including a first ferromagnetic layer, a tunneling layer, and a second ferromagnetic layer;
   forming a nonconductive layer that overlies the magnetic memory cell structure;
   etching the nonconductive layer to expose a portion of the multiple layers, the exposed portion of the multiple layers excluding the tunneling layer and portions of the multiple layers beyond the tunneling layer; and
   forming a conductive layer over the magnetic memory cell structure and the nonconductive layer, the conductive layer having a first dimension in an area over the nonconductive layer and a second dimension in an area over the portion of the top layer of the memory cell structure, the first and second dimensions measured in the same relative direction and the magnitude of the second dimension less than the magnitude of the first dimension.

9. The method of claim 8, wherein the multiple layers further includes a barrier layer, wherein the barrier layer is superjacent the first ferromagnetic layer.

10. The method of claim 9, wherein etching includes etching the nonconductive layer to expose a portion of the barrier layer.

11. The method of claim 10, wherein etching includes etching using a dry etch technique.

12. The method of claim 10, wherein etching includes etching to form a trench for a copper damascene process.

13. A method for forming a magnetic memory device, comprising:
   forming a magnetic memory cell having the characteristic to change between first and second states when subject to application of a magnetic field having a magnitude greater than a threshold value;
   forming a nonconductive layer overlying the magnetic memory cell;
   etching a trench in the nonconductive layer that exposes at least a portion of the magnetic memory cell, the trench having a width; and
   forming a conductive line in the trench having a first portion and a second portion, the first portion of the conductive line adjacent to the exposed portion of the magnetic memory cell and having a first cross-sectional area, the second portion of the conductive line having a second cross-sectional area greater than the first cross-sectional area.

14. The method of claim 13, wherein forming the magnetic memory cell comprises:
   forming a barrier layer having a thickness of approximately five nanometers;
   forming a seed layer over the barrier layer from a nickel ferrite material;
   forming a pinning layer over the seed layer from an anti-ferromagnetic material;
   forming a pinned layer over the pinning layer from a ferromagnetic material;
   forming a tunneling layer over the pinned layer from dialuminum trioxide;
   forming a sense layer over the tunneling layer from a ferromagnetic material; and
   forming another barrier layer from a tantalum material.

15. The method of claim 13 wherein the first and second cross-sectional areas are defined by a respective width and height, the first and second widths measured in the same direction as the width of the trench, the method further comprising removing conductive material from the trench adjacent the exposed portion of the magnetic memory cell to reduce the first width to less than the second width.

16. The method of claim 15 wherein filling the trench with a conductive material to form a conductive line comprises:
   electrochemical plating to deposit conductive material into the trench;
   planarize the trench to remove overfill of the conductive material; and
   wherein removing conductive material from the trench comprises:
      photolithographing to partially expose portions of the conductive line adjacent the exposed portion of the magnetic memory cell; and
      etching the partially exposed portion of the conductive line to define the first width of the conductive line.

17. The method of claim 13 wherein the first and second cross-sectional areas are defined by a respective width and height, the height measured in a direction perpendicular to the width of the trench and wherein the first height is less than the second height.

18. The method of claim 17 wherein etching the trench in the nonconductive layer comprises:
   forming the trench having a first depth and a second depth, the first depth measuring from the top of the trench to the exposed portion of the magnetic memory cell, the second depth less than the first depth.

* * * * *